US012731633B2

(12) United States Patent
Wang

(10) Patent No.: US 12,731,633 B2
(45) Date of Patent: Sep. 8, 2026

(54) SEMICONDUCTOR STRUCTURE AND METHOD FOR MANUFACTURING SAME, ELECTRONIC DEVICE

(71) Applicant: CXMT Corporation, Hefei City (CN)

(72) Inventor: Jia Wang, Hefei City (CN)

(73) Assignee: CXMT Corporation, Hefei City (CN)

(*) Notice: Subject to any disclaimer, the term of this patent is extended or adjusted under 35 U.S.C. 154(b) by 104 days.

(21) Appl. No.: 18/953,746

(22) Filed: Nov. 20, 2024

(65) Prior Publication Data

US 2025/0078910 A1 Mar. 6, 2025

Related U.S. Application Data

(63) Continuation of application No. PCT/CN2024/085224, filed on Apr. 1, 2024.

(30) Foreign Application Priority Data

Apr. 6, 2023 (CN) ........................ 202310357951.3

(51) Int. Cl.

*G11C 11/4096* (2006.01)
*G11C 11/4093* (2006.01)
*H03K 3/037* (2006.01)
*H03K 19/20* (2006.01)

(52) U.S. Cl.

CPC ...... *G11C 11/4096* (2013.01); *G11C 11/4093* (2013.01); *H03K 3/037* (2013.01); *H03K 19/20* (2013.01)

(58) Field of Classification Search

CPC ................................................ G11C 11/4096
See application file for complete search history.

(56) References Cited

U.S. PATENT DOCUMENTS

2008/0298159 A1* 12/2008 Kawabata ................ G11C 7/10 365/233.5

* cited by examiner

*Primary Examiner* — Hoai V Ho
(74) *Attorney, Agent, or Firm* — Syncoda LLC; Feng Ma

(57) ABSTRACT

The write conversion circuit includes a first latch circuit, provided with a first input terminal, a second input terminal, a third input terminal, a control terminal, and an output terminal. The first input terminal receives first data, the second input terminal receives a first input signal, with the first input signal being generated based on second data, the third input terminal receives an inverted signal of a first identification signal, and the control terminal receives a second identification signal. The first latch circuit is used to select and output either the first data or the second data based on the second identification signal. The first identification signal is an identification signal of a compressed write mode; the second identification signal and the first identification signal together determine a data write mode of the first latch circuit, which includes the compressed write mode and a normal write mode.

12 Claims, 5 Drawing Sheets

Memory

Write conversion circuit

SEMICONDUCTOR STRUCTURE AND METHOD FOR MANUFACTURING SAME, ELECTRONIC DEVICE

CROSS-REFERENCE TO RELATED APPLICATIONS

This is a continuation of International Patent Application No. PCT/CN2024/085224 filed on Apr. 1, 2024, which claims priority to Chinese Patent Application No. 202310357951.3 filed on Apr. 6, 2023. The disclosures of the above-referenced applications are hereby incorporated by reference in their entirety.

BACKGROUND

With the development of memory technology, memory is widely used in various fields. For example, Dynamic Random Access Memory (DRAM) is used extensively.

The data input/output circuit in memory is used for data interaction with external devices. The present disclosure involves the optimized design of the data input/output circuit of memory.

SUMMARY

The present disclosure relates but is not limited to, a write conversion circuit and a memory.

The present disclosure provides a write conversion circuit. The write conversion circuit includes: a first latch circuit.

The first latch circuit is provided with a first input terminal, a second input terminal, a third input terminal, a control terminal, and an output terminal; the first input terminal of the first latch circuit receives first data, the second input terminal of the first latch circuit receives a first input signal, with the first input signal being generated based on second data, the third input terminal of the first latch circuit receives an inverted signal of a first identification signal, and the control terminal of the first latch circuit receives a second identification signal; the first latch circuit outputs the first data or the second data at the output terminal, wherein the first identification signal is an identification signal of a compressed write mode; the first identification signal and the second identification signal together determine a data write mode of the first latch circuit, and the data write mode includes the compressed write mode and a normal write mode.

In some examples, the first latch circuit includes: a forward circuit and a feedback circuit.

The forward circuit includes a feedback terminal and an output terminal, and the feedback circuit includes a first input terminal, a second input terminal, a third input terminal, an output terminal, and a control terminal;

the first input terminal of the feedback circuit receives the first input signal, the second input terminal of the feedback circuit receives the inverted signal of the first identification signal, and the third input terminal of the feedback circuit is connected to the output terminal of the forward circuit; and the output terminal of the feedback circuit is connected to the feedback terminal of the forward circuit, and the control terminal of the feedback circuit receives the second identification signal; the output terminal of the feedback circuit outputs a second input signal to the feedback terminal of the forward circuit, and the forward circuit outputs the second data at the output terminal; the second input signal is generated based on the first input signal.

In some examples, the feedback circuit includes: a first inverter and an AND-OR-NOT gate.

A control terminal of the AND-OR-NOT gate receives the second identification signal, and an inverted control terminal of the AND-OR-NOT gate receives an inverted signal of the second identification signal;

a first AND gate input terminal of the AND-OR-NOT gate receives the inverted signal of the first identification signal, and a second AND gate input terminal of the AND-OR-NOT gate serves as the third input terminal of the feedback circuit; and an input terminal of the first inverter receives an inverted signal of the second data, and a first NOR gate input terminal of the AND-OR-NOT gate is connected to an output terminal of the first inverter; a result of an AND gate logic between a signal at the first AND gate input terminal and a signal at the second AND gate input terminal serves as a second NOR gate input signal of the AND-OR-NOT gate, and a NOR gate output terminal of the AND-OR-NOT gate outputs the inverted signal of the second data.

In some examples, the AND-OR-NOT gate includes: a first PMOS transistor, a second PMOS transistor, a third PMOS transistor, a fourth PMOS transistor, a first NMOS transistor, a second NMOS transistor, a third NMOS transistor, and a fourth NMOS transistor.

A first terminal of the first PMOS transistor is connected to a first power supply terminal, a second terminal of the first PMOS transistor is connected to a first terminal of the second PMOS transistor, and a control terminal of the first PMOS transistor and a control terminal of the fourth NMOS transistor are connected together to serve as the first NOR gate input terminal of the AND-OR-NOT gate;

a second terminal of the second PMOS transistor is connected to a first terminal of the third PMOS transistor, and a control terminal of the second PMOS transistor and a control terminal of the second NMOS transistor are connected together to serve as the second AND gate input terminal of the AND-OR-NOT gate;

a second terminal of the third PMOS transistor and a first terminal of the first NMOS transistor are connected together to serve as the NOR gate output terminal of the AND-OR-NOT gate, and a control terminal of the third PMOS transistor serves as the inverted control terminal of the AND-OR-NOT gate;

a first terminal of the fourth PMOS transistor is connected to the first terminal of the second PMOS transistor, a second terminal of the fourth PMOS transistor is connected to the second terminal of the second PMOS transistor, and a control terminal of the fourth PMOS transistor and a control terminal of the third NMOS transistor are connected together to serve as the first AND gate input terminal of the AND-OR-NOT gate;

a second terminal of the first NMOS transistor is connected to a first terminal of the second NMOS transistor, and a control terminal of the first NMOS transistor serves as the control terminal of the AND-OR-NOT gate;

a second terminal of the second NMOS transistor is connected to a first terminal of the third NMOS transistor, and a second terminal of the third NMOS transistor is connected to a second power supply terminal; and a first terminal of the fourth NMOS transistor is connected to the first terminal of the second NMOS transistor, and a second terminal of the fourth NMOS transistor is connected to the second power supply terminal.

In some examples, the forward circuit further includes: an input terminal and a control terminal.

The input terminal of the forward circuit receives the first data, and the control terminal of the forward circuit receives the inverted signal of the second identification signal; the forward circuit outputs the first data, and the output terminal of the feedback circuit outputs an inverted signal of the first data to the feedback terminal of the forward circuit.

In some examples, both the feedback circuit and the forward circuit include two control terminals.

The control terminal of the feedback circuit receives the second flag signal, and an inverted control terminal of the feedback circuit receives the inverted signal of the second identification signal;

the control terminal of the forward circuit receives the inverted signal of the second identification signal, and an inverted control terminal of the forward circuit receives the second identification signal; and the control terminal of the feedback circuit and the control terminal of the forward circuit are active-high control terminals, and the inverted control terminal of the feedback circuit and the inverted control terminal of the forward circuit are active-low control terminals.

In some examples, the forward circuit includes: a gated inverter and a second inverter.

An input terminal of the gated inverter receives the first data, a control terminal of the gated inverter receives the inverted signal of the second identification signal, and an inverted control terminal of the gated inverter receives the second identification signal; and an output terminal of the gated inverter is connected to an input terminal of the second inverter, the input terminal of the second inverter serves as the feedback terminal of the forward circuit, and an output terminal of the second inverter serves as the output terminal of the forward circuit.

In some examples, the gated inverter includes: a fifth PMOS transistor, a sixth PMOS transistor, a fifth NMOS transistor, and a sixth NMOS transistor.

a first terminal of the fifth PMOS transistor is connected to the first power supply terminal, a second terminal of the fifth PMOS transistor is connected to a first terminal of the sixth PMOS transistor, and a control terminal of the fifth PMOS transistor and a control terminal of the sixth NMOS transistor are connected together to serve as the input terminal of the gated inverter;

a second terminal of the sixth PMOS transistor and a first terminal of the fifth NMOS transistor are connected together to serve as the output terminal of the gated inverter, and a control terminal of the sixth PMOS transistor receives the inverted signal of the second identification signal; and a second terminal of the fifth NMOS transistor is connected to a first terminal of the sixth NMOS transistor, and a control terminal of the fifth NMOS transistor receives the second identification signal; a second terminal of the sixth NMOS transistor is connected to the second power supply terminal.

In some examples, the write conversion circuit further includes: a first control circuit.

A first output terminal of the first control circuit is connected to the control terminal of the first latch circuit, a second output terminal of the first control circuit is connected to an inverted control terminal of the first latch circuit, a first input terminal of the first control circuit receives a normal write control signal, and a second input terminal of the first control circuit receives the first identification signal; the first output terminal of the first control circuit outputs the second identification signal, and the second output terminal of the first control circuit outputs the inverted signal of the second identification signal.

In some examples, the first control circuit includes: a first NOR gate and a third inverter.

A first input terminal of the first NOR gate receives the normal write control signal, a second input terminal of the first NOR gate receives the first identification signal, an output terminal of the first NOR gate is connected to an input terminal of the third inverter, an output terminal of the third inverter outputs the second identification signal, and the output terminal of the first NOR gate outputs the inverted signal of the second identification signal.

In some examples, the write conversion circuit further includes: a fourth control circuit.

A first input terminal of the fourth control circuit receives a set control signal, a second input terminal of the fourth control circuit receives second data, and an output terminal of the fourth control circuit outputs the inverted signal of the second data in the compressed write mode.

The present disclosure provides a memory. The memory includes the write conversion circuit according to the above examples.

The write conversion circuit provided according to the present disclosure includes a first latch circuit. The first latch circuit includes three input terminals. The first input terminal receives the first data, the second input terminal receives the first input signal, and the third input terminal receives the inverted signal of the first identification signal. The control terminal receives the second identification signal. The first identification signal is an identification signal of the compressed write mode. The data write mode of the first latch circuit is determined by the first identification signal and the second identification signal, which in turn determines whether the first latch circuit outputs the first data or the second data. With such a setup, the first latch circuit can transmit both the first data and the second data without needing to add devices before the first latch circuit to integrate the second data into the transmission path of the first data, thus not affecting the transmission time of the first data.

BRIEF DESCRIPTION OF THE DRAWINGS

The drawings, which are incorporated in and constitute a part of this specification, illustrate embodiments consistent with the present disclosure and, together with the specification, serve to explain the principles of the present disclosure.

Figure 1:
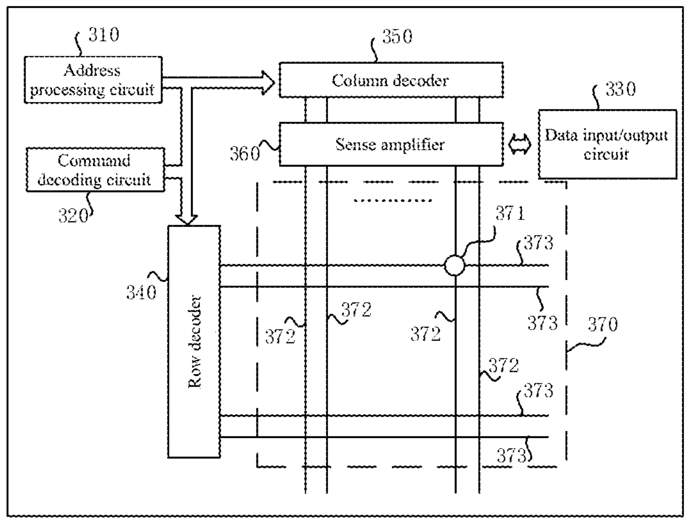
FIG. 1 is a schematic diagram of a memory architecture.

Through the above drawings, explicit embodiments of the present disclosure have been illustrated, and more detailed descriptions will follow. These drawings and textual descriptions are not intended to limit the scope of the inventive concept of the present disclosure in any way, but rather to explain the concepts of the present disclosure to those skilled in the art by referring to specific embodiments.

DETAILED DESCRIPTION

Exemplary embodiments will be described in detail herein, with examples shown in the drawings. In the following description referring to the drawings, unless otherwise indicated, the same numbers in different drawings represent the same or similar elements. The embodiments described in the following exemplary embodiments do not represent all embodiments consistent with the present disclosure. Instead, they are merely examples of devices and methods consistent with some aspects of the present disclosure.

In the description of the present disclosure, the terms "first" and "second" are used only for descriptive purposes and should not be understood as indicating or implying relative importance or implicitly specifying the quantity of the indicated technical features. Thus, features defined with "first" and "second" may explicitly or implicitly include one or more of such features. In the description of the present disclosure, the term "plurality" means two or more, unless otherwise explicitly specified.

In the description of the present disclosure, it should be noted that unless otherwise explicitly specified and defined, the terms "connected" and "coupled" should be understood in a broad sense, for example, they may be fixed connections, detachable connections, or integral connections; they may be mechanical connections or electrical connections; they may be directly connected or indirectly connected through an intermediary. For those of ordinary skill in the art, the specific meanings of the above terms in the present disclosure can be understood according to specific conditions.

Currently, memory technology is developing rapidly. Taking DRAM as an example, the main applications include Synchronous Dynamic Random-Access Memory (SDRAM), various generations of Double Data Rate (DDR) SDRAM, and various generations of Low Power Double Data Rate (LPDDR) SDRAM, among others.

FIG. 1 is an example diagram of a memory architecture. As shown in FIG. 1, using DRAM as an example, the memory includes an address processing circuit 310, a command decoding circuit 320, a data input/output circuit 330, a row decoder 340, a column decoder 350, a sense amplifier 360, and a memory area 370. The address processing circuit 310, the command decoding circuit 320, and the data input/output circuit 330 belong to a peripheral-area circuit, while the row decoder 340, the column decoder 350, the sense amplifier 360, and the memory area 370 belong to an array-area circuit. The memory area 370 mainly consists of memory cells 371, bit lines 372, and word lines 373. The word lines 373 in the memory area 370 extend along the row direction, and the bit lines 372 in the memory area 370 extend along the column direction. The intersection of the word lines 373 and the bit lines 372 forms the memory cells 371 of the memory area 370.

Figure 2:
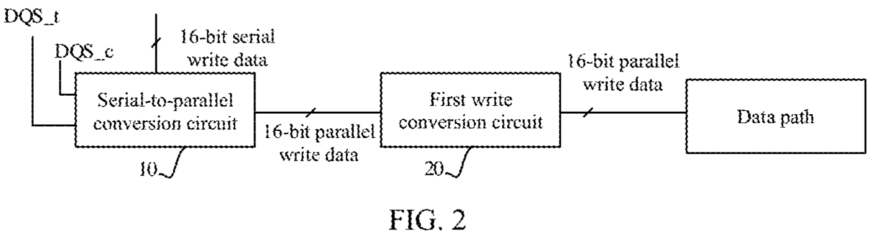
FIG. 2 is a circuit diagram of a portion of a data input/output circuit.

FIG. 2 is a circuit diagram of a portion of a data input/output circuit. As shown in FIG. 2, the data input/output circuit includes a serial-to-parallel conversion circuit 10 and a first write conversion circuit 20. The input terminal of the serial-to-parallel conversion circuit 10 receives a plurality of sets of serial write data, converting each set of serial write data into a set of parallel write data for output under the control of the serial write clocks DQS_t and DQS_c. The input terminal of the first write conversion circuit 20 is connected to the output terminal of the serial-to-parallel conversion circuit 10. The first write conversion circuit 20 transmits the write data of each bit in each set of parallel write data to the corresponding data path.

Figure 3:
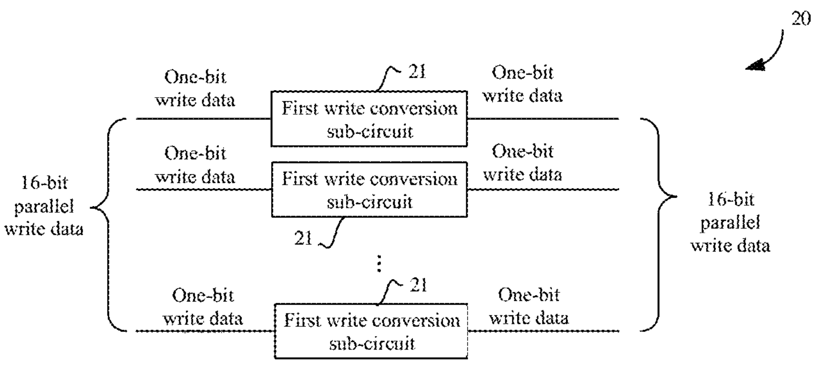
FIG. 3 is a specific circuit diagram of a first write conversion circuit.

FIG. 3 is a circuit diagram of a first write conversion circuit 20. As shown in FIG. 3, the first write conversion circuit 20 includes a plurality of first write conversion sub-circuits 21. Each first write conversion sub-circuit 21 receives one-bit write data from a set of parallel write data and outputs one-bit write data to the corresponding data path.

FIGS. 2 and 3 describe the data writing process using 16-bit data bits for each set of serial write data, with a total of three sets of serial write data received (only one set is shown in the figure) as an example. The serial-to-parallel conversion circuit 10 first converts the first set of 16-bit serial write data into a set of 16-bit parallel write data for output, then converts the second set of 16-bit serial write data into a set of 16-bit parallel write data for output, and finally converts the third set of 16-bit serial write data into a set of 16-bit parallel write data for output. For any i-th first write conversion sub-circuit 21, i is a positive integer, and $1 \le i \le 16$. The input terminal of the i-th first write conversion sub-circuit 21 first receives the i-th bit of write data from the first set of 16-bit parallel write data, then receives the i-th bit of write data from the second set of 16-bit parallel write data, and finally receives the i-th bit of write data from the third set of 16-bit parallel write data. That is, each first write conversion sub-circuit 21 will receive three-bit write data, and the first write conversion sub-circuit 21 sequentially transmits the three-bit write data to the data path corresponding to the first write conversion sub-circuit 21.

Figure 4:
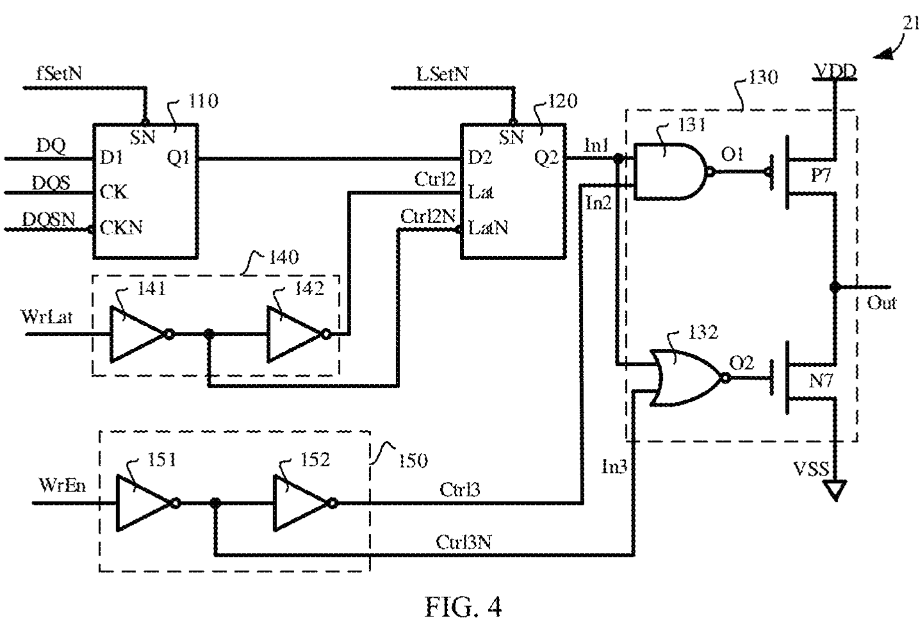
FIG. 4 is a specific circuit diagram of a first write conversion circuit.

FIG. 4 is a circuit diagram of a first write conversion sub-circuit 21. As shown in FIG. 4, the first write conversion sub-circuit 21 includes a second sampling circuit 110, a second latch circuit 120, and a drive circuit 130.

The second sampling circuit 110 includes an input terminal D1, a clock terminal CK, an inverted clock terminal CKN, and an output terminal Q1. The input terminal D1 of the second sampling circuit 110 serves as the input terminal of the first write conversion sub-circuit 21, and input terminal D1 of the second sampling circuit 110 receives multi-bit write data DQ. The clock terminal CK of the second sampling circuit 110 receives the parallel write clock DQS, and the inverted clock terminal CKN of the second sampling circuit 110 receives the inverted signal DQSN of the parallel write clock. Under the control of the parallel write clock DQS and the inverted signal DQSN of the parallel write clock, the second sampling circuit 110 samples and then outputs the multi-bit write data DQ received at the input terminal D1. The second sampling circuit 110 further includes a set terminal SN, and the set terminal SN of the second sampling circuit 110 receives a sampling set signal fSetN. The sampling set signal fSetN controls the output terminal Q1 of the second sampling circuit 110 to output a set level, for example, output a high level. In some embodiments, the second sampling circuit 110 may be implemented using a D flip-flop with a set function.

The input terminal D2 of the second latch circuit 120 is connected to the output terminal Q1 of the second sampling circuit 110. The control terminal Lat of the second latch circuit 120 receives the second control signal Ctrl2, and the inverted control terminal LatN receives the inverted signal Ctrl2N of the second control signal. Under the control of the second control signal Ctrl2 and the inverted signal Ctrl2N of the second control signal, the second latch circuit 120 transmits the write data DQ from the input terminal D2 thereof to the output terminal Q2 thereof for output and latches the data. The second latch circuit 120 further includes a set terminal SN, and the set terminal SN of the second latch circuit 120 receives a latch set signal LSetN. The latch set signal LSetN controls the output terminal Q2 of the second latch circuit 120 to output a set level, for example, output a high level.

The first input terminal In1 of the driver circuit 130 is connected to the output terminal Q2 of the second latch circuit 120. The second input terminal In2 of the driver circuit 130 receives the third control signal Ctrl3, and the third input terminal In3 of the driver circuit 130 receives the inverted signal Ctrl3N of the third control signal. Under the control of the third control signal Ctrl3 and the inverted signal Ctrl3N of the third control signal, the driver circuit 130 amplifies and outputs the write data DQ from the first input terminal In1 thereof.

In some examples, the first write conversion sub-circuit 21 includes a second control circuit 140. The input terminal of the second control circuit 140 receives a normal write control signal WrLat and generates a second control signal Ctrl2 and an inverted signal Ctrl2N of the second control signal based on the normal write control signal WrLat. The specific structure of the second control circuit 140 can be designed according to actual needs. Here, as an example, the second control circuit 140 includes two inverters in series, which are the fifth inverter 141 and the sixth inverter 142. The output terminal of the fifth inverter 141 is connected to the input terminal of the sixth inverter 142, and the input terminal of the fifth inverter 141 receives the normal write control signal WrLat. The output terminal of the fifth inverter 141 outputs the inverted signal Ctrl2N of the second control signal, and the output terminal of the sixth inverter 142 outputs the second control signal Ctrl2.

In some examples, the first write conversion sub-circuit 21 includes a third control circuit 150. The input terminal of the third control circuit 150 receives a write enable signal WrEn and generates a third control signal Ctrl3 and an inverted signal Ctrl3N of the third control signal based on the write enable signal WrEn. The specific structure of the third control circuit 150 can be designed according to actual needs. Here, as an example, the third control circuit 150 includes two inverters in series, which are the seventh inverter 151 and the eighth inverter 152. The output terminal of the seventh inverter 151 is connected to the input terminal of the eighth inverter 152, and the input terminal of the seventh inverter 151 receives the write enable signal WrEn. The output terminal of the seventh inverter 151 outputs the inverted signal Ctrl3N of the third control signal, and the output terminal of the eighth inverter 152 outputs the third control signal Ctrl3.

The second latch circuit 120 may be a D latch. When the second control signal Ctrl2 is at a low level and the inverted signal Ctrl2N of the second control signal is at a high level, the second latch circuit 120 transmits the write data DQ from the input terminal D2 thereof to the output terminal Q2 thereof for output. When the second control signal Ctrl2 is at a high level and the inverted signal Ctrl2N of the second control signal is at a low level, the second latch circuit 120 latches the write data DQ at the output terminal Q2 thereof.

The driver circuit 130 can be designed according to requirements. Here, the circuit shown in FIG. 4 is used as an example for illustration. The driver circuit 130 includes a first NAND gate 131, a third NOR gate 132, a seventh PMOS transistor P7, and a seventh NMOS transistor N7. The first input terminal of the first NAND gate 131 and the first input terminal of the third NOR gate 132 are connected together to serve as the first input terminal In1 of the driver circuit 130. The first input terminal In1 of the driver circuit 130 receives the write data DQ. The second input terminal of the first NAND gate 131 serves as the second input terminal In2 of the driver circuit 130, and the second input terminal In2 of the driver circuit 130 receives the third control signal Ctrl3. The second input terminal of the third NOR gate 132 serves as the third input terminal In3 of the driver circuit 130, and the third input terminal In3 of the driver circuit 130 receives the inverted signal Ctrl3N of the third control signal. The output terminal O1 of the first NAND gate 131 is connected to the control terminal of the seventh PMOS transistor P7, and the output terminal O2 of the third NOR gate 132 is connected to the control terminal of the seventh NMOS transistor N7. The first terminal of the seventh PMOS transistor P7 is connected to the first power supply terminal VDD, and the second terminal of the seventh PMOS transistor P7 is connected to the first terminal of the seventh NMOS transistor N7 to serve as the output terminal Out of the driver circuit 130. The second terminal of the seventh NMOS transistor N7 is connected to the second power supply terminal VSS.

The following describes the operation principle of the first write conversion sub-circuit 21 shown in FIG. 4. For any one-bit write data DQ, the operation process of the first write conversion sub-circuit 21 may be divided into three stages. The three stages include a sampling circuit operation stage, a latch circuit operation stage, and a driver circuit operation stage.

During the sampling circuit operation stage, the level state of the parallel write clock DQS of one sampling period includes a low level and a high level. Under the control of the parallel write clock DQS, the second sampling circuit 110 samples the write data DQ at the input terminal D1 thereof and then outputs the one-bit write data DQ for the current sampling period at its output terminal Q1.

During the latch circuit operation stage, the level state of the normal write control signal WrLat corresponding to the one-bit write data DQ for the current sampling period includes a low level and a high level. When the normal write control signal WrLat is at a low level, the second control signal Ctrl2 is at a low level, and the inverted signal Ctrl2N of the second control signal is at a high level. The second latch circuit 120 transmits the one-bit write data DQ for the current sampling period to the output terminal Q2. When the normal write control signal WrLat is at a high level, the second control signal Ctrl2 is at a high level, and the inverted signal Ctrl2N of the second control signal is at a low level. The second latch circuit 120 blocks the data at the input terminal D2 thereof and latches the one-bit write data DQ for the current sampling period at the output terminal Q2. With such a setup, the data at the input terminal D2 of the second latch circuit 120 does not affect the data at the output terminal Q2 of the second latch circuit 120, allowing the second latch circuit 120 to latch and output the one-bit write data DQ for the current sampling period at the output terminal Q2.

During the driver circuit operation stage, the level state of the write enable signal WrEn corresponding to the one-bit write data DQ for the current sampling period is high, the third control signal Ctrl3 is at a high level, and the inverted signal Ctrl3N of the third control signal is at a low level. The driver circuit 130 enhances the write data DQ at the first input terminal In1 and then outputs the data. More specifically, when the write data DQ at the first input terminal In1 of the driver circuit 130 is at a high level, the output terminal O1 of the first NAND gate 131 outputs a low level, the output terminal O2 of the third NOR gate 132 outputs a low level, the seventh PMOS transistor P7 turns on, the seventh NMOS transistor N7 turns off, and the potential of the output terminal Out of the driver circuit 130 is at a high level. When the sampled data at the first input terminal of the driver circuit 130 is at a low level, the output terminal O1 of the first NAND gate 131 outputs a high level, the output terminal O2 of the third NOR gate 132 outputs a high level, the seventh PMOS transistor P7 turns off, the seventh NMOS transistor N7 turns on, and the potential of the output terminal Out of the driver circuit 130 is at a low level.

In practical applications, memory operates in either a normal write mode or a compressed write mode. In the normal write mode, data for each memory cell in the target memory area needs to be received, and the data is transmitted to the corresponding data path through the serial-to-parallel conversion circuit 10 and the first write conversion circuit 20. For example, if the number of the data for the memory cells in the target memory area is 16, then 16-bit data needs to be received. The compressed write mode refers to writing the same data into each memory cell in the target memory area. In the compressed write mode, only one-bit data needs to be received, which is transmitted to the corresponding data path by the first write conversion circuit 20. The compressed write mode is typically used for memory testing, but the compressed write mode is not limited to memory testing.

Figure 5:
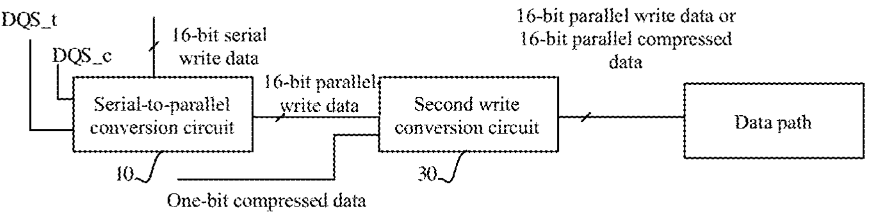
FIG. 5 is a circuit diagram of a portion of another data input/output circuit.
Figure 6:
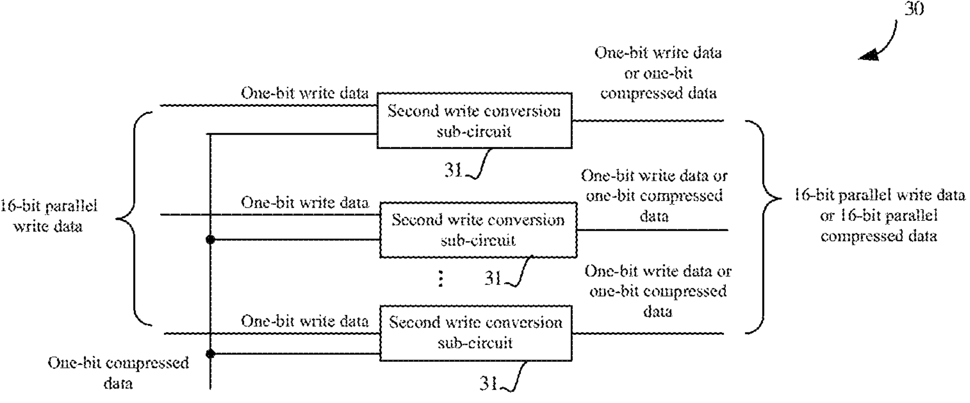
FIG. 6 is a specific circuit diagram of another second write conversion circuit.

Based on this, the first write conversion circuit 20 is optimized and improved. As shown in FIGS. 5 and 6, a second write conversion circuit 30 is proposed. The second write conversion circuit 30 includes a plurality of second write conversion sub-circuits 31. Each second write conversion sub-circuit 31 includes two input terminals: a first input terminal and a second input terminal. The first input terminal of the second write conversion sub-circuit 31 serves as the parallel data input terminal of the second write conversion circuit 30 and receives one-bit write data DQ. The second input terminal of each second write conversion sub-circuit 31 is connected to the same node to receive one-bit compressed data. Furthermore, a first identification signal is designed (not shown in FIGS. 5 and 6), which serves as the identification signal of the compressed write mode. The first identification signal controls the second write conversion sub-circuit 31 to output the one-bit write data DQ or the one-bit compressed data to the data path. Here, the compressed data is specifically for the compressed write mode.

Figure 7:
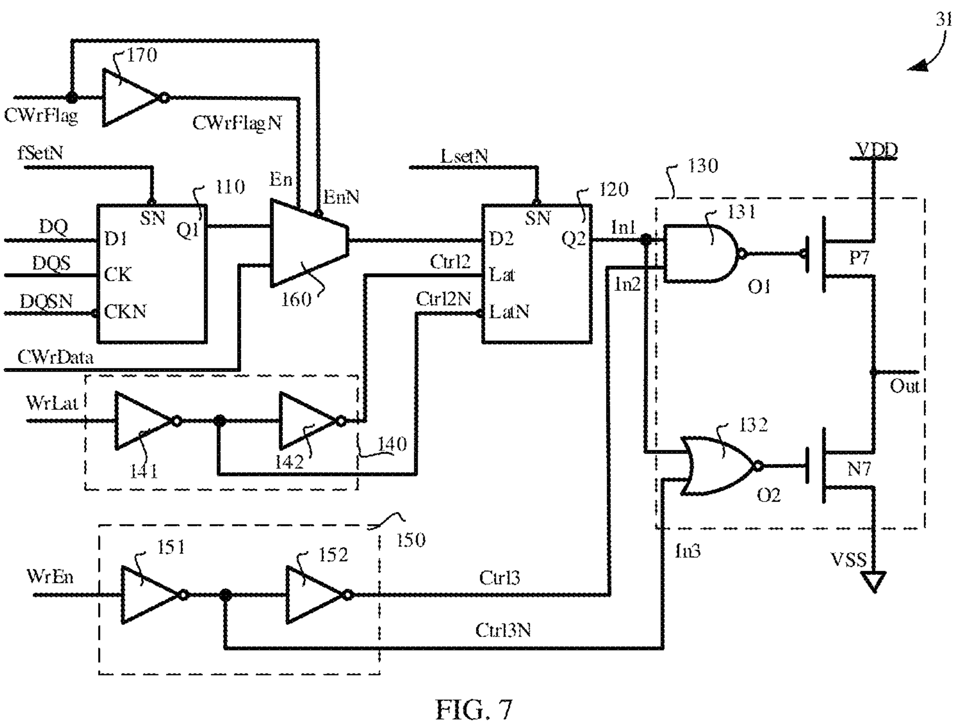
FIG. 7 is a specific circuit diagram of another second write conversion circuit.

As shown in FIG. 7, the second write conversion sub-circuit 31 includes a second sampling circuit 110, a selector 160, a second latch circuit 120, a driver circuit 130, a second control circuit 140, a third control circuit 150, and a ninth inverter 170. The difference from FIG. 4 is that the input terminal D1 of the second sampling circuit 110 serves as the first input terminal of the second write conversion sub-circuit 31, and the input terminal D1 of the second sampling circuit 110 receives the write data DQ. The output terminal Q1 of the second sampling circuit 110 is connected to the first input terminal of the selector 160. The second input terminal of the selector 160 serves as the second input terminal of the second write conversion sub-circuit 31 and receives the compressed data CWrData. The selection terminal En of the selector 160 is connected to the input terminal of the ninth inverter 170, and the input terminal of the ninth inverter 170 receives the first identification signal CWrFlag. The selection terminal En of the selector 160 receives the inverted signal CWrFlagN of the first identification signal output by the output terminal of the ninth inverter 170. The inverted selection terminal EnN of the selector 160 receives the first identification signal CWrFlag, and the first identification signal CWrFlag is the identification signal of the compressed write mode. The output terminal of the selector 160 is connected to the input terminal D2 of the second latch circuit 120.

When operating in the compressed write mode, the first identification signal CWrFlag is at a high level, and the inverted signal CWrFlagN of the first identification signal is at a low level. The selector 160 outputs the compressed data CWrData, which is transmitted to the corresponding data path through the second latch circuit 120 and the driver circuit 130. When operating in the normal write mode, the first identification signal CWrFlag is at a low level, and the inverted signal CWrFlagN of the first identification signal is at a high level. The selector 160 outputs the write data DQ, which is transmitted to the corresponding data path through the second latch circuit 120 and the driver circuit 130.

However, to transmit the compressed data CWrData to the data path through the second write conversion sub-circuit 31, it is necessary to add a selector 160 in the first write conversion sub-circuit 21. In the normal write mode, the write data DQ needs to pass through the selector 160 before being transmitted to the second latch circuit 120, which will increase the time delay of the write data DQ in the normal write mode.

Some aspects of the embodiments of the present disclosure relate to the above considerations. The following provides an exemplary introduction to the solution in conjunction with some embodiments of the present disclosure. For ease of description, the write data DQ at the first input terminal Din1 of the first latch circuit 220 will be described as the first data DQ, and the compressed data CWrData received by the first latch circuit 220 will be described as the second data CWrData.

Figure 8:
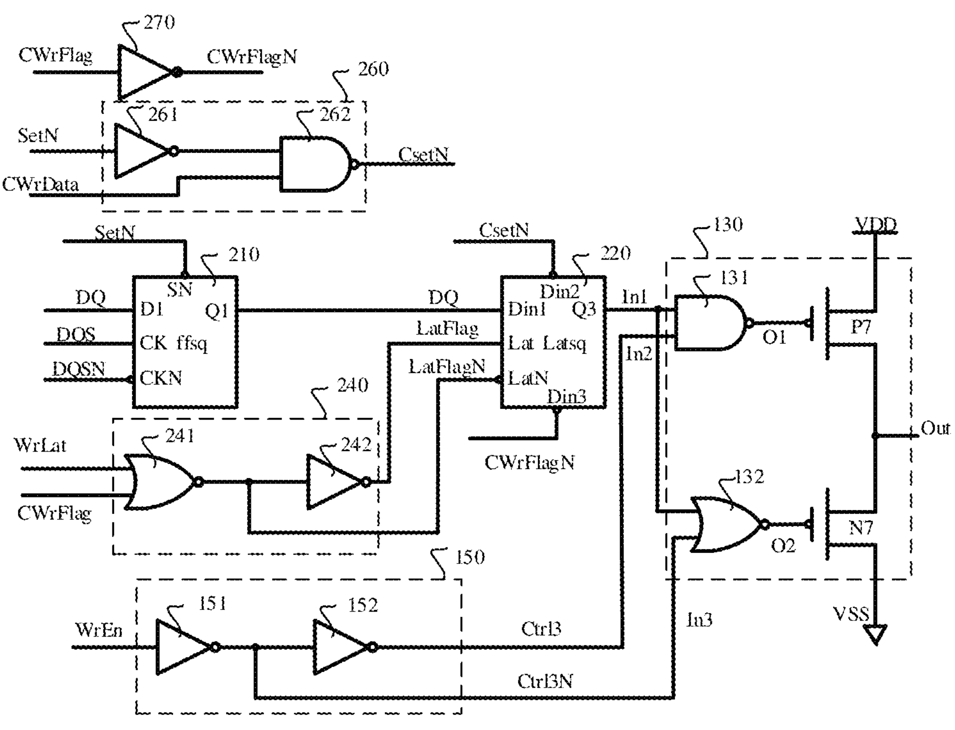
FIG. 8 is a specific circuit diagram of yet another write conversion circuit.

As shown in FIG. 8, an embodiment of the present disclosure provides a write conversion circuit. The write conversion circuit includes a first latch circuit 220. The first latch circuit 220 includes a first input terminal Din1, a second input terminal Din2, a third input terminal Din3, a control terminal Lat, and an output terminal Q3. The first input terminal Din1 of the first latch circuit 220 receives the first data DQ. The second input terminal Din2 of the first latch circuit 220 receives the first input signal CsetN, and the first input signal CsetN is generated based on the second data CWrData. The third input terminal Din3 of the first latch circuit 220 receives the inverted signal CWrFlagN of the first identification signal, and the first identification signal CWrFlag is the identification signal of the compressed write mode. The control terminal Lat of the first latch circuit 220 receives the second identification signal LatFlag. The output terminal of the first latch circuit 220 outputs the first data DQ or the second data CWrData.

The first identification signal CWrFlag and the second identification signal LatFlag determine the data write mode of the first latch circuit 220. The data write mode includes a normal write mode and a compressed write mode, which further determine whether the first latch circuit 220 outputs the first data DQ or the second data CWrData. The normal write mode includes a pass-through sub-mode and a latch sub-mode. More specifically, when the first identification signal CWrFlag and the second identification signal LatFlag indicate the compressed write mode, the first latch circuit 220 outputs the second data CWrData at the output terminal. When the first identification signal CWrFlag and the second identification signal LatFlag indicate the pass-through sub-mode of the normal write mode, the first latch circuit 220 outputs the first data DQ at the output terminal. When the first identification signal CWrFlag and the second identification signal LatFlag indicate the latch sub-mode of the normal write mode, the first latch circuit 220 latches the first data DQ at the output terminal.

In the above technical solution, the first latch circuit 220 includes three input terminals. The first input terminal Din1 receives the first data DQ, the second input terminal Din2 receives the first input signal CsetN, and the third input terminal Din3 receives the inverted signal CWrFlagN of the first identification signal. The control terminal Lat receives the second identification signal LatFlag. The first identification signal CWrFlag is the identification signal of the compressed write mode. The data write mode of the first latch circuit 220 is determined by the first identification signal CWrFlag and the second identification signal LatFlag, which in turn determines whether the first latch circuit 220 outputs the first data DQ or the second data CWrData. With such a setup, the first latch circuit 220 can transmit both the first data DQ and the second data CWrData without needing to add devices before the first latch circuit 220 to integrate the second data CWrData into the transmission path of the first data DQ. This does not affect the transmission time of the first data DQ, keeps the chip area of the write conversion circuit relatively small, and does not add extra paths.

Figures 9, 10:
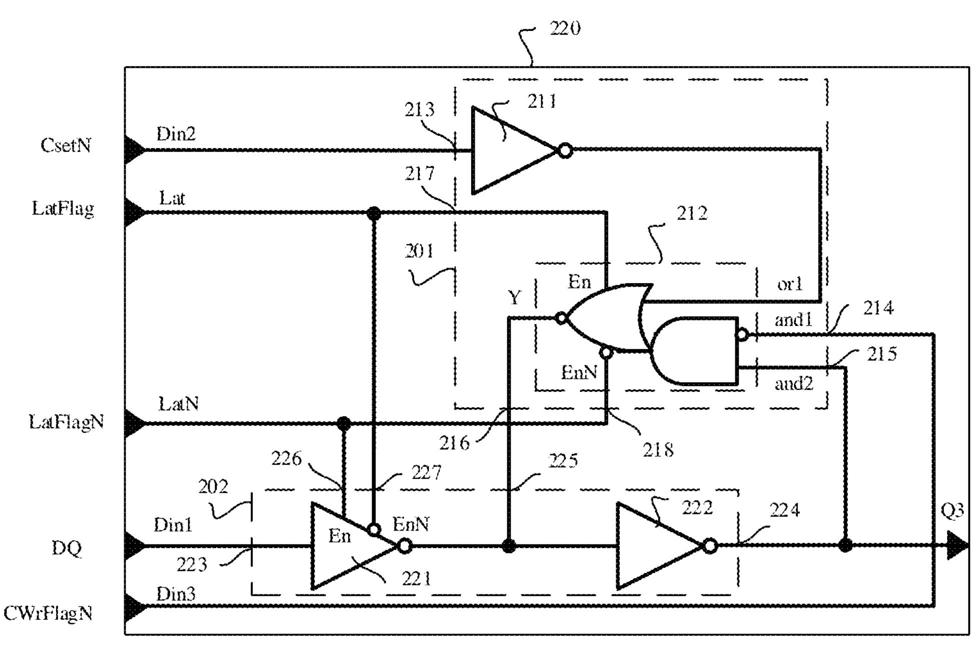
FIG. 9 is a circuit diagram of a latch circuit within the write conversion circuit shown in FIG. 8.
FIG. 10 is a specific circuit diagram of an AND-OR-NOT gate.

The first latch circuit 220 can be designed according to requirements. Here, an example where the first latch circuit 220 includes a forward circuit 202 and a feedback circuit 201 is used for illustration. As shown in FIG. 9, the forward circuit 202 includes an input terminal 223, an output terminal 224, and a feedback terminal 225. The feedback circuit 201 includes a first input terminal 213, a second input terminal 214, a third input terminal 215, an output terminal 216, and a control terminal 217.

The first input terminal 213 of the feedback circuit 201 serves as the second input terminal Din2 of the first latch circuit 220 and receives the first input signal CsetN. The second input terminal 214 of the feedback circuit 201 serves as the third input terminal Din3 of the first latch circuit 220 and receives the inverted signal CWrFlagN of the first identification signal. The third input terminal 215 of the feedback circuit 201 is connected to the output terminal 224 of the forward circuit 202, and the output terminal 216 of the feedback circuit 201 is connected to the feedback terminal 225 of the forward circuit 202. The control terminal 217 of the feedback circuit 201 receives the second identification signal LatFlag. The output terminal 224 of the forward circuit 202 serves as the output terminal Q3 of the first latch circuit 220.

Under the control of the first identification signal CWrFlag and the second identification signal LatFlag, the feedback circuit 201 determines whether to output the second input signal to the feedback terminal 225 of the forward circuit 202. The second input signal is generated based on the first input signal CsetN. More specifically, when the first identification signal CWrFlag and the second identification signal LatFlag indicate the compressed write mode, the feedback circuit 201 outputs the corresponding data at the output terminal 216 thereof based on the first input signal, and the forward circuit 202 outputs the second data CWrData based on the data at the feedback terminal 225. With such a setup, when the first identification signal CWrFlag and the second identification signal LatFlag indicate the compressed write mode, the second data CWrData is output at the output terminal Q3 of the first latch circuit 220.

In the above technical solution, the first latch circuit 220 includes a forward circuit 202 and a feedback circuit 201. The feedback circuit 201 is configured with three input terminals. The first input terminal 213 receives the first input signal CsetN, the second input terminal 214 receives the inverted signal CWrFlagN of the first identification signal, and the third input terminal 215 is connected to the output terminal 224 of the forward circuit 202. Moreover, the feedback terminal 225 of the forward circuit 202 is connected to the output terminal 216 of the feedback circuit 201. Under the control of the first identification signal CWrFlag and the second identification signal LatFlag, the forward circuit 202 and the feedback circuit 201 achieve the compressed write mode.

The input terminal 223 of the forward circuit 202 serves as the first input terminal Din1 of the first latch circuit 220 and receives the first data DQ. The control terminal 226 of the forward circuit 202 receives the inverted signal LatFlagN of the second identification signal. When the first identification signal CWrFlag and the second identification signal LatFlag indicate the pass-through sub-mode under the normal write mode, the forward circuit 202 transmits the first data DQ from the input terminal 223 thereof to the output terminal 224 thereof. In this case, the output terminal 216 of the feedback circuit 201 stops outputting data to the feedback terminal 225 of the forward circuit 202. This prevents the forward circuit 202 from encountering errors that could arise from needing to simultaneously transmit data from both the input terminal 223 and the feedback terminal 225.

When the first identification signal CWrFlag and the second identification signal LatFlag indicate the latch sub-mode under the normal write mode, the forward circuit 202 blocks the first data DQ at the input terminal 223, and the feedback circuit 201 outputs the corresponding data at the output terminal 216 thereof based on the data from the third input terminal 215 thereof. In one example, the first identification signal CWrFlag and the second identification signal LatFlag first indicate the pass-through sub-mode under the normal write mode and then indicate the latch sub-mode under the normal write mode. With such a setup, when in the pass-through sub-mode under the normal write mode, the forward circuit 202 transmits the first data DQ from the input terminal 223 to the output terminal 224. In the latch sub-mode under the normal write mode, the feedback circuit 201 outputs the corresponding data at the output terminal 216 thereof based on the first data DQ from the third input terminal 215 thereof. The forward circuit 202 then transmits the data from the feedback terminal 225 thereof to the output terminal 224 of the forward circuit 202, thereby latching the first data DQ at the output terminal 224 of the forward circuit 202.

In the above technical solution, the first latch circuit 220 includes a forward circuit 202 and a feedback circuit 201. The third input terminal 215 of the feedback circuit 201 is connected to the output terminal 224 of the forward circuit 202, the feedback terminal 225 of the forward circuit 202 is connected to the output terminal 216 of the feedback circuit 201, and the input terminal 223 of the forward circuit 202 receives the first data DQ. Under the control of the first identification signal CWrFlag and the second identification signal LatFlag, the forward circuit 202 and the feedback circuit 201 achieve the normal write mode.

In some examples, the second identification signal LatFlag is used to control whether the feedback circuit 201 outputs data to the feedback terminal 225 of the forward circuit 202 and to control whether the forward circuit 202 blocks the data at the input terminal 223 thereof. The corresponding relationship between the level state of the second identification signal LatFlag and the control result can be designed. For example, when the second identification signal LatFlag is at a high level, the second identification signal LatFlag controls the feedback circuit 201 to output data to the feedback terminal 225 of the forward circuit 202. Meanwhile, the inverted signal LatFlagN of the second identification signal controls the forward circuit 202 to block the first data DQ at the input terminal 223. Subsequently, the forward circuit 202 outputs the data from the feedback terminal 225 to its output terminal 224. When the second identification signal LatFlag is at a low level, the second identification signal LatFlag controls the feedback circuit 201 to stop outputting data to the feedback terminal 225 of the forward circuit 202. The inverted signal LatFlagN of the second identification signal controls the forward circuit 202 to output the first data DQ from the input terminal 223 thereof.

More specifically, the forward circuit 202 includes two control terminals, which are the control terminal 226 and the inverted control terminal 227. The feedback circuit 201 includes two control terminals, which are the control terminal 217 and the inverted control terminal 218. The control terminal 217 of the feedback circuit 201 and the control terminal 226 of the forward circuit 202 are both active-high control terminals, while the inverted control terminal 218 of the feedback circuit 201 and the inverted control terminal 227 of the forward circuit 202 are active-low control terminals. The control terminal 217 of the feedback circuit 201 and the inverted control terminal 227 of the forward circuit 202 are connected together to serve as the control terminal Lat of the first latch circuit 220. The inverted control terminal 218 of the feedback circuit 201 and the control terminal 226 of the forward circuit 202 are connected together to serve as the inverted control terminal LatN of the first latch circuit 220. The control terminal 217 of the feedback circuit 201 receives the second identification signal LatFlag, and the inverted control terminal 218 of the feedback circuit 201 receives the inverted signal LatFlagN of the second identification signal. The control terminal 226 of the forward circuit 202 receives the inverted signal LatFlagN of the second identification signal, and the inverted control terminal 227 of the forward circuit 202 receives the second identification signal LatFlag.

In some examples, the first identification signal CWrFlag is used to control whether the feedback circuit 201 blocks the data at the third input terminal 215 thereof. The corresponding relationship between the level state of the first identification signal CWrFlag and the control result can be designed. For example, when the first identification signal CWrFlag is at a high level, it controls the feedback circuit 201 to block the data at the third input terminal 215 thereof. If the second identification signal LatFlag is at a high level, the feedback circuit 201 outputs the corresponding data at the output terminal 216 based on the first input signal CsetN from the first input terminal 213. When the first identification signal CWrFlag is at a low level, the data at the third input terminal 215 of the feedback circuit 201 is not blocked. If the second identification signal LatFlag is at a high level, the feedback circuit 201 outputs the corresponding data at the output terminal 216 based on the data from the third input terminal 215.

In some examples, by combining the level states of the first identification signal CWrFlag and the second identification signal LatFlag, the data write mode of the first latch circuit 220 is determined by the first identification signal CWrFlag and the second identification signal LatFlag.

When both the first identification signal CWrFlag and the second identification signal LatFlag are at high levels, the feedback circuit 201 blocks the data at the third input terminal 215 thereof, and the feedback circuit 201 outputs the corresponding data at the output terminal 216 based on the first input signal CsetN from the first input terminal 213; subsequently, the forward circuit 202 outputs the second data CWrData at the output terminal 224 based on the data from the feedback terminal 225, such that the first identification signal CWrFlag and the second identification signal LatFlag can control the first latch circuit 220 to operate in the compressed write mode.

When the second identification signal LatFlag is at a low level, the feedback circuit 201 stops outputting data to the feedback terminal 225 of the forward circuit 202, and the forward circuit 202 outputs the first data DQ from the input terminal 223 thereof, such that the first identification signal CWrFlag and the second identification signal LatFlag can control the first latch circuit 220 to operate in the pass-through sub-mode of the normal write mode.

When the first identification signal CWrFlag is at a low level and the second identification signal LatFlag is at a high level, the feedback circuit 201 outputs the corresponding data at the output terminal 216 based on the data from the third input terminal 215, and the forward circuit 202 outputs the data from the feedback terminal 225 thereof to the output terminal 224 thereof, such that the first identification signal CWrFlag and the second identification signal LatFlag can control the first latch circuit 220 to operate in the latch sub-mode. Further, after the forward circuit 202 outputs the first data DQ from the input terminal 223 thereof to the output terminal 224, the first identification signal CWrFlag is set to a low level and the second identification signal LatFlag is set to a high level, such that the first identification signal CWrFlag and the second identification signal LatFlag can control the first latch circuit 220 to operate in the latch sub-mode of the normal write mode.

In some examples, as shown in FIG. 8, the write conversion circuit further includes a first control circuit 240. The first input terminal of the first control circuit 240 receives the normal write control signal WrLat, and the second input terminal of the first control circuit 240 receives the first identification signal CWrFlag. The first output terminal of the first control circuit 240 is connected to the control terminal Lat of the first latch circuit 220, and the second output terminal of the first control circuit 240 is connected to the inverted control terminal LatN of the first latch circuit 220. The first output terminal of the first control circuit 240 outputs the second identification signal LatFlag, and the second output terminal of the first control circuit 240 outputs the inverted signal LatFlagN of the second identification signal.

More specifically, when the first identification signal CWrFlag is at a high level, regardless of whether the normal write control signal WrLat is at a high level or low level, the second identification signal LatFlag output by the first control circuit 240 is at a high level, and the first control circuit 240 controls the first latch circuit 220 to operate in the compressed mode. When the first identification signal CWrFlag is at a low level, if the normal write control signal WrLat is at a low level, the second identification signal LatFlag output by the first control circuit 240 is at a low level, and the first control circuit 240 controls the first latch circuit 220 to operate in the pass-through sub-mode. When the first identification signal CWrFlag is at a low level, if the normal write control signal WrLat is at a high level, the second identification signal LatFlag output by the first control circuit 240 is at a high level, and the first control circuit 240 controls the first latch circuit 220 to operate in the latch sub-mode.

The specific structure of the first control circuit 240 can be designed according to the control logic of the first control circuit 240. The first control circuit 240 includes a first NOR gate 241 and a third inverter 242. The first input terminal of the first NOR gate 241 receives the normal write control signal WrLat, and the second input terminal of the first NOR gate 241 receives the first identification signal CWrFlag, the output terminal of the first NOR gate 241 is connected to the input terminal of the third inverter 242, and the output terminal of the first NOR gate 241 outputs the inverted signal of the second identification signal LatFlagN. The output terminal of the third inverter 242 outputs the second identification signal LatFlag.

In some examples, the write conversion circuit further includes a fourth control circuit 260. The first input terminal of the fourth control circuit 260 receives the set control signal SetN, the second input terminal of the fourth control circuit 260 receives the second data CWrData, and the output terminal of the fourth control circuit 260 outputs the inverted signal of the second data.

In some logic design examples of the fourth control circuit 260, when the set control signal SetN is at a high level, the output terminal of the fourth control circuit 260 outputs a high-level first input signal CsetN. When the set control signal SetN is at a low level, the output terminal of the fourth control circuit 260 outputs the inverted signal of the second data.

The circuit structure can be designed according to the control logic of the fourth control circuit 260. More specifically, the fourth control circuit 260 includes a fourth inverter 261 and a second NAND gate 262. The input terminal of the fourth inverter 261 serves as the first input terminal of the fourth control circuit 260 and the input terminal of the fourth inverter 261 receives the set control signal SetN. The output terminal of the fourth inverter 261 is connected to the first input terminal of the second NAND gate 262; the second input terminal of the second NAND gate 262 serves as the first input terminal of the fourth control circuit 260 and the second input terminal of the second NAND gate 262 receives the second data CWrData. When the actual set control signal Set is at a high level and the set control signal SetN is at a low level, the second NAND gate 262 outputs the inverted signal of the second data, and the inverted signal of the second data is input to the first latch circuit 220. When the actual set control signal Set is at a low level and the set control signal SetN is at a high level, the second NAND gate 262 outputs a high-level first input signal CsetN to the first latch circuit 220, such that the first NOR gate input terminal or1 of the AND-OR-NOT gate 212 of the first latch circuit 220 is at a low level. This does not affect the signal processing of the second and third input terminals of the AND-OR-NOT gate 212 of the first latch circuit 220.

In other logic design examples of the fourth control circuit 260, when the set control signal SetN is at a high level, the output terminal of the fourth control circuit 260 outputs the inverted signal of the second data. When the set control signal SetN is at a high level and the second data CWrData is at a low level, the fourth control circuit 260 outputs a high-level first input signal CsetN.

The circuit structure can be designed according to the control logic of the fourth control circuit 260. More specifically, the fourth control circuit 260 includes a tenth inverter and a second NOR gate. The input terminal of the tenth inverter receives the set control signal SetN, the output terminal of the tenth inverter is connected to the first input terminal of the second NOR gate, and the second input terminal of the second NOR gate receives the second data CWrData. When the set control signal SetN is at a high level, the output terminal of the fourth control circuit 260 outputs the inverted signal of the second data. When the set control signal SetN is at a high level and the second data CWrData is continuously at a low level, the fourth control circuit 260 outputs a high-level first input signal CsetN.

In some examples, the write conversion circuit further includes an eleventh inverter 270. The input terminal of the eleventh inverter 270 receives the first identification signal CWrFlag, and the output terminal of the eleventh inverter 270 outputs the inverted signal CWrFlagN of the first identification signal.

In some examples, the write conversion circuit further includes a first sampling circuit 210, a drive circuit 130, and a third control circuit 150. The first sampling circuit 210 includes an input terminal D1, a clock terminal CK, an inverted clock terminal CKN, a sampling set terminal SN, and an output terminal Q1. The input terminal D1 of the first sampling circuit 210 receives the multi-bit first data DQ, the clock terminal CK of the first sampling circuit 210 receives the parallel write clock DQS, and the inverted clock terminal CKN of the first sampling circuit 210 receives the inverted signal DQSN of the parallel write clock. Under the control of the parallel write clock DQS and the inverted signal DQSN of the parallel write clock, the first sampling circuit 210 samples the multi-bit first data DQ at the input terminal and outputs the first data DQ. The sampling set terminal SN receives the set control signal SetN. When the set control signal SetN is at a low level, it controls the output terminal of the first sampling circuit 210 to be at the set potential.

The output terminal Q1 of the first sampling circuit 210 is connected to the first input terminal Din1 of the first latch circuit 220, and the output terminal Q3 of the first latch circuit 220 is connected to the first input terminal In1 of the drive circuit 130. The second input terminal In2 of the drive circuit 130 receives the third control signal Ctrl3, and the third input terminal In3 of the drive circuit 130 receives the inverted signal Ctrl3N of the third control signal. The operation process of the drive circuit 130 is the same as the operation process of the drive circuit 130 shown in FIG. 4, which will not be repeated here. The third control circuit 150 has already been described in the first write conversion sub-circuit 21 shown in FIG. 4, which will not be repeated here.

The forward circuit 202 and feedback circuit 201 can be designed according to requirements, as illustrated in the structure shown in FIG. 9. As shown in FIG. 9, in a design example of the feedback circuit 201, the first input signal CsetN is the inverted signal of the second data. The feedback circuit 201 includes a first inverter 211 and an AND-OR- NOT gate 212. The AND-OR-NOT gate 212 includes a control terminal En, an inverted control terminal EnN, a first AND gate input terminal and1, a second AND gate input terminal and2, a first NOR gate input terminal or1, and a NOR gate output terminal Y.

The input terminal of the first inverter 211 serves as the first input terminal 213 of the feedback circuit 201 and receives the inverted signal of the second data. The output terminal of the first inverter 211 is connected to the first NOR gate input terminal or1 of the AND-OR-NOT gate 212. The first AND gate input terminal and1 of the AND-OR-NOT gate 212 serves as the second input terminal 214 of the feedback circuit 201 and receives the inverted signal CWrFlagN of the first identification signal. The second AND gate input terminal and2 of the AND-OR-NOT gate 212 serves as the third input terminal 215 of the feedback circuit 201 and is connected to the output terminal 224 of the forward circuit 202. The data from the first AND gate input terminal and1 and the data from the second AND gate input terminal and2 are subjected to an AND logic operation to serve as another NOR gate input signal for the AND-OR-NOT gate 212. The control terminal En of the AND-OR-NOT gate 212 receives the second identification signal LatFlag, and the inverted control terminal EnN of the AND-OR-NOT gate 212 receives the inverted signal LatFlagN of the second identification signal. The output terminal Y of the AND-OR-NOT gate 212 serves as the output terminal 216 of the feedback circuit 201 and is connected to the feedback terminal 225 of the forward circuit 202.

The control terminal En of the AND-OR-NOT gate 212 is an active-high control terminal, and the inverted control terminal EnN of the AND-OR-NOT gate 212 is an active-low control terminal. When the second identification signal LatFlag is at a high level and the inverted signal LatFlagN of the second identification signal is at a low level, the output terminal Y of the AND-OR-NOT gate 212 outputs data. When the second identification signal LatFlag is at a low level and the inverted signal LatFlagN of the second identification signal is at a high level, the output terminal Y of the AND-OR-NOT gate 212 stops outputting data.

When the inverted signal CWrFlagN of the first identification signal is at a low level, meaning the data received by the first AND gate input terminal and is at a low level, the data at the second AND gate input terminal and2 is blocked, another NOR gate input signal of the AND-OR-NOT gate 212 is at a low level, and the first NOR gate input terminal or1 of the AND-OR-NOT gate 212 receives the second data CWrData. Under the control of the second identification signal LatFlag and the inverted signal LatFlagN of the second identification signal, the AND-OR-NOT gate 212 outputs the inverted signal of the second data.

When the inverted signal CWrFlagN of the first identification signal is at a high level, meaning the data received by the first AND gate input terminal and1 is at a high level, the data from the first AND gate input terminal and1 and the data from the second AND gate input terminal and2 are subjected to an AND logic operation to output the data from the second AND gate input terminal and2. In other words, another NOR gate input signal of the AND-OR-NOT gate 212 is the data from the second AND gate input terminal and2. The first NOR gate input terminal or1 of the AND-OR-NOT gate 212 receives a low level, and the AND-OR-NOT gate 212 outputs the inverted signal of the data from the second AND gate input terminal and2, thereby enabling the feedback circuit 201 to output the data from the third input terminal thereof.

In the above technical solution, the feedback circuit 201 includes a first inverter 211 and an AND-OR-NOT gate 212. The AND-OR-NOT gate 212 includes a control terminal En, an inverted control terminal EnN, a first AND gate input terminal and1, a second AND gate input terminal and2, a first NOR gate input terminal or1, and a NOR gate output terminal Y. The control terminal En receives the second identification signal LatFlag, and the inverted control terminal EnN receives the inverted signal of the second identification signal LatFlagN. The first AND gate input terminal and1 receives the inverted signal CWrFlagN of the first identification signal. The first NOR gate input terminal or1 receives the second data CWrData or a low level. Under the control of the first identification signal CWrFlag and the second identification signal LatFlag, the AND-OR-NOT gate 212 outputs the corresponding data at the output terminal based on the second data CWrData or the data from the second AND gate input terminal and2. This can reduce data output delay. In particular, compared to a structure where an AND gate, a NOR gate, and a transmission gate are cascaded to implement the function of the feedback circuit 201, this design results in less data output delay and occupies less chip area.

In another design example of the feedback circuit 201, the first input signal CsetN is the second data CWrData. The feedback circuit 201 includes an AND-OR-NOT gate. The AND-OR-NOT gate includes a control terminal, an inverted control terminal, a first AND gate input terminal, a second AND gate input terminal, a first NOR gate input terminal, and a NOR gate output terminal. The first OR gate input terminal of the AND-OR-NOT gate serves as the first input terminal In1 of the feedback circuit 201 and receives the second data CWrData. The first AND gate input terminal of the AND-OR-NOT gate serves as the second input terminal In2 of the feedback circuit 201 and receives the inverted signal CWrFlagN of the first identification signal. The second AND gate input terminal of the AND-OR-NOT gate serves as the third input terminal In3 of the feedback circuit 201 and is connected to the output terminal 224 of the forward circuit 202. The operation process of the AND-OR-NOT gate is the same as that of the structure shown in FIG. 9, which will not be repeated here.

In a design example of the forward circuit 202, as shown in FIG. 9, the forward circuit 202 includes a gated inverter 221 and a second inverter 222. The gated inverter 221 includes two control terminals, which are the control terminal En and the inverted control terminal EnN. The control terminal En of the gated inverter 221 receives the inverted signal LatFlagN of the second identification signal, and the inverted control terminal EnN of the gated inverter 221 receives the second identification signal LatFlag. The output terminal of the gated inverter 221 is connected to the input terminal of the second inverter 222. The input terminal of the gated inverter 221 serves as the input terminal 223 of the forward circuit 202 and receives the first data DQ. The input terminal of the second inverter 222 serves as the feedback terminal 225 of the forward circuit 202 and is connected to the output terminal 216 of the feedback circuit 201. The output terminal of the second inverter 222 serves as the output terminal 224 of the forward circuit 202.

When the second identification signal LatFlag is at a low level and the inverted signal LatFlagN of the second identification signal is at a high level, the gated inverter 221 outputs the inverted signal of the first data DQ, and the output terminal of the second inverter 222 outputs the first data DQ. When the second identification signal LatFlag is at a high level and the inverted signal LatFlagN of the second identification signal is at a low level, the gated inverter 221 blocks the first data DQ at the input terminal thereof, and the second inverter 222 outputs the corresponding data at the output terminal 224 based on the data output from the output terminal 216 of the feedback circuit 201. The data output from the output terminal 216 of the feedback circuit 201 may be the first input signal CsetN or the inverted signal of the data from the third input terminal 215 of the feedback circuit 201.

In a design example of the AND-OR-NOT gate 212, as shown in FIG. 10, the AND-OR-NOT gate 212 includes a first PMOS transistor P1, a second PMOS transistor P2, a third PMOS transistor P3, a fourth PMOS transistor P4, a first NMOS transistor N1, a second NMOS transistor N2, a third NMOS transistor N3, and a fourth NMOS transistor N4. The first terminal of the first PMOS transistor P1 is connected to the first power supply terminal VCC, and the second terminal of the first PMOS transistor P1 is connected to the first terminal of the second PMOS transistor P2. The control terminal of the first PMOS transistor P1 and the control terminal of the fourth NMOS transistor N4 are connected together to serve as the first NOR gate input terminal or1 of the AND-OR-NOT gate 212.

The second terminal of the second PMOS transistor P2 is connected to the first terminal of the third PMOS transistor P3. The control terminal of the second PMOS transistor P2 and the control terminal of the second NMOS transistor N2 are connected together to serve as the second AND gate input terminal and2 of the AND-OR-NOT gate 212. The second terminal of the third PMOS transistor P3 and the first terminal of the first NMOS transistor N1 are connected together to serve as the NOR gate output terminal Y of the AND-OR-NOT gate 212. The control terminal of the third PMOS transistor P3 serves as the inverted control terminal EnN of the AND-OR-NOT gate 212.

The first terminal of the fourth PMOS transistor P4 is connected to the first terminal of the second PMOS transistor P2, and the second terminal of the fourth PMOS transistor P4 is connected to the second terminal of the second PMOS transistor P2. The control terminal of the fourth PMOS transistor P4 and the control terminal of the third NMOS transistor N3 are connected together to serve as the first AND gate input terminal and1 of the AND-OR-NOT gate 212. The second terminal of the first NMOS transistor N1 is connected to the first terminal of the second NMOS transistor N2. The control terminal of the first NMOS transistor N1 is the control terminal En of the AND-OR-NOT gate 212. The second terminal of the second NMOS transistor N2 is connected to the first terminal of the third NMOS transistor N3, and the second terminal of the third NMOS transistor N3 is connected to the second power supply terminal VSS. The first terminal of the fourth NMOS transistor N4 is connected to the first terminal of the second NMOS transistor N2, and the second terminal of the fourth NMOS transistor N4 is connected to the second power supply terminal VSS.

TABLE 1

Operation Logic Table for AND-OR-NOT Gate 212

| Serial number | or1 | EnN | En | and2 | and1 | Y |
|---|---|---|---|---|---|---|
| 1 | x | 1 | 0 | x | x | — |
| 2 | 1 | 0 | 1 | x | 0 | 0 |
| 3 | 0 | 0 | 1 | x | 0 | 1 |
| 4 | 0 | 0 | 1 | 1 | 1 | 0 |

TABLE 1-continued

Operation Logic Table for AND-OR-NOT Gate 212

| Serial number | or1 | EnN | En | and2 | and1 | Y |
|---|---|---|---|---|---|---|
| 5 | 0 | 0 | 1 | 0 | 1 | 1 |

Table 1 is the operation logic table for AND-OR-NOT gate 212, as shown in Table 1. "1" represents a high level, "0" represents a low level, and "×" represents either a high level or a low level. "–" represents an indeterminate level.

In the above technical solution, the AND-OR-NOT gate 212 includes four PMOS transistors and four NMOS transistors. The four PMOS transistors and four NMOS transistors perform an AND logic operation on the data from the first AND gate input terminal and1 and the second AND gate input terminal and2, followed by a NOR logic operation with the data from the first NOR gate input terminal or1. Compared to a solution where an AND gate, a NOR gate, and a transmission gate are cascaded, this design can reduce data transmission delay and the AND-OR-NOT gate 212 occupies less chip area.

Figures 11, 12:
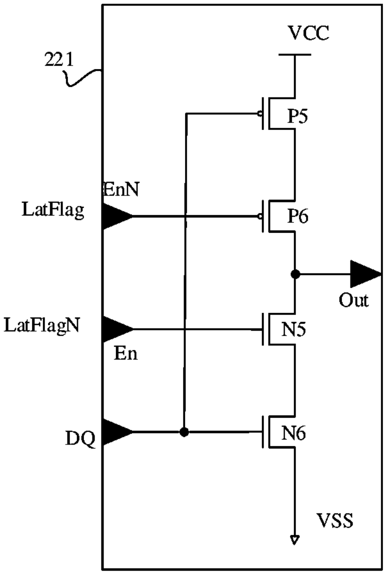
FIG. 11 is a specific circuit diagram of a gated inverter.
FIG. 12 is a circuit diagram of a memory.

In a design example of the gated inverter 221, as shown in FIG. 11, the gated inverter 221 includes a fifth PMOS transistor P5, a sixth PMOS transistor P6, a fifth NMOS transistor N5, and a sixth NMOS transistor N6. The first terminal of the fifth PMOS transistor P5 is connected to the first power supply terminal VCC, and the second terminal of the fifth PMOS transistor P5 is connected to the first terminal of the sixth PMOS transistor P6. The control terminal of the fifth PMOS transistor P5 and the control terminal of the sixth NMOS transistor N6 are connected together to serve as the input terminal of the gated inverter 221. The second terminal of the sixth PMOS transistor P6 and the first terminal of the fifth NMOS transistor N5 are connected together to serve as the output terminal Out of the gated inverter 221. The control terminal of the sixth PMOS transistor P6 serves as the inverted control terminal EnN of the gated inverter 221 and receives the second identification signal LatFlag. The second terminal of the fifth NMOS transistor N5 is connected to the first terminal of the sixth NMOS transistor N6. The control terminal of the fifth NMOS transistor N5 serves as the control terminal En of the gated inverter 221 and receives the inverted signal LatFlagN of the second identification signal. The second terminal of the sixth NMOS transistor N6 is connected to the second power supply terminal VSS.

The second identification signal LatFlag controls whether the gated inverter 221 outputs data. The second identification signal LatFlag is at a low level, and the inverted signal LatFlagN of the second identification signal is at a high level; the control terminal En of the gated inverter 221 is at a high level, and the inverted control terminal EnN of the gated inverter 221 is at a low level. Both the sixth PMOS transistor P6 and the fifth NMOS transistor N5 are in a conducting state, allowing the output terminal of the gated inverter 221 to output data. The second identification signal LatFlag is at a high level, and the inverted signal LatFlagN of the second identification signal is at a low level; the control terminal En of the gated inverter 221 is at a low level, and the inverted control terminal EnN of the gated inverter 221 is at a high level. Both the sixth PMOS transistor P6 and the fifth NMOS transistor N5 are in an off state, resulting in an indeterminate potential at the output terminal of the gated inverter 221.

The present disclosure further provides a memory, as shown in FIG. 12. The memory includes the write conversion circuit from any of the embodiments described above, and the write conversion circuit is used to store both normally written data and data written in a compressed write mode into the memory cells of the memory.

It should be noted that the terms “high level” and “low level” in the above embodiments are relative concepts (i.e., the voltage value of the high level is higher than the voltage value of the corresponding low level). The specific voltage values for high and low levels are not limited. Moreover, the high levels applied to different signal lines in the specific embodiment are not necessarily equal. For example, the high level on a bit line and the high level on a word line may be different voltages. Additionally, the same signal line is not restricted to having equal high levels at different stages. For example, the high level applied to a bit line when writing a “1” and during a read operation may be different voltage values. Those skilled in the art should understand that the values for high and low levels can be set independently based on process nodes, speed requirements, reliability requirements, and other factors.

Those skilled in the art will readily conceive other embodiments of the present disclosure after considering the specification and practicing the invention disclosed herein. The present disclosure is intended to cover any variations, uses, or adaptations of the present disclosure, and these variations, uses, or adaptations follow the general principles of the present disclosure and include the common knowledge or conventional techniques in the art that are not disclosed herein. The specification and embodiments are to be regarded as illustrative only, and the true scope and spirit of the present disclosure are indicated by the following claims.

It should be understood that the present disclosure is not limited to the precise structures described above and illustrated in the drawings, and various modifications and changes may be made without departing from the scope of the present disclosure. The scope of the present disclosure is limited only by the appended claims.

What is claimed is:

1. A write conversion circuit, comprising: a first latch circuit, wherein the first latch circuit is provided with a first input terminal, a second input terminal, a third input terminal, a control terminal, and an output terminal, wherein the first input terminal of the first latch circuit receives first data, the second input terminal of the first latch circuit receives a first input signal, with the first input signal being generated based on second data, and the third input terminal of the first latch circuit receives an inverted signal of a first identification signal; the control terminal of the first latch circuit receives a second identification signal, and the first latch circuit is configured to select and output either the first data or the second data based on the second identification signal; the first latch circuit outputs the first data or the second data at the output terminal, wherein the first identification signal is an identification signal of a compressed write mode; the first identification signal and the second identification signal together determine a data write mode of the first latch circuit, and the data write mode comprises the compressed write mode and a normal write mode.

2. The write conversion circuit according to claim 1, wherein the first latch circuit comprises: a forward circuit and a feedback circuit, wherein the forward circuit comprises a feedback terminal and an output terminal, and the feedback circuit comprises a first input terminal, a second input terminal, a third input terminal, an output terminal, and a control terminal, wherein the first input terminal of the feedback circuit receives the first input signal, the second input terminal of the feedback circuit receives the inverted signal of the first identification signal, and the third input terminal of the feedback circuit is connected to the output terminal of the forward circuit; and the output terminal of the feedback circuit is connected to the feedback terminal of the forward circuit, and the control terminal of the feedback circuit receives the second identification signal; the output terminal of the feedback circuit outputs a second input signal to the feedback terminal of the forward circuit, and the forward circuit outputs the second data at the output terminal; the second input signal is generated based on the first input signal.

3. The write conversion circuit according to claim 2, wherein the feedback circuit comprises: a first inverter and an AND-OR-NOT gate, wherein a control terminal of the AND-OR-NOT gate receives the second identification signal, and an inverted control terminal of the AND-OR-NOT gate receives an inverted signal of the second identification signal;

a first AND gate input terminal of the AND-OR-NOT gate receives the inverted signal of the first identification signal, and a second AND gate input terminal of the AND-OR-NOT gate serves as the third input terminal of the feedback circuit; and an input terminal of the first inverter receives an inverted signal of the second data, and a first NOR gate input terminal of the AND-OR-NOT gate is connected to an output terminal of the first inverter; a result of an AND logic operation between a signal at the first AND gate input terminal and a signal at the second AND gate input terminal serves as a second NOR gate input signal of the AND-OR-NOT gate, and a NOR gate output terminal of the AND-OR-NOT gate outputs the inverted signal of the second data.

4. The write conversion circuit according to claim 3, wherein the AND-OR-NOT gate comprises: a first PMOS transistor, a second PMOS transistor, a third PMOS transistor, a fourth PMOS transistor, a first NMOS transistor, a second NMOS transistor, a third NMOS transistor, and a fourth NMOS transistor wherein a first terminal of the first PMOS transistor is connected to a first power supply terminal, a second terminal of the first PMOS transistor is connected to a first terminal of the second PMOS transistor, and a control terminal of the first PMOS transistor and a control terminal of the fourth NMOS transistor are connected together to serve as the first NOR gate input terminal of the AND-OR-NOT gate;

a second terminal of the second PMOS transistor is connected to a first terminal of the third PMOS transistor, and a control terminal of the second PMOS transistor and a control terminal of the second NMOS transistor are connected together to serve as the second AND gate input terminal of the AND-OR-NOT gate;

a second terminal of the third PMOS transistor and a first terminal of the first NMOS transistor are connected together to serve as the NOR gate output terminal of the AND-OR-NOT gate, and a control terminal of the third PMOS transistor serves as the inverted control terminal of the AND-OR-NOT gate;

a first terminal of the fourth PMOS transistor is connected to the first terminal of the second PMOS transistor, a second terminal of the fourth PMOS transistor is connected to the second terminal of the second PMOS transistor, and a control terminal of the fourth PMOS transistor and a control terminal of the third NMOS transistor are connected together to serve as the first AND gate input terminal of the AND-OR-NOT gate;

a second terminal of the first NMOS transistor is connected to a first terminal of the second NMOS transistor, and a control terminal of the first NMOS transistor serves as the control terminal of the AND-OR-NOT gate;

a second terminal of the second NMOS transistor is connected to a first terminal of the third NMOS transistor, and a second terminal of the third NMOS transistor is connected to a second power supply terminal; and a first terminal of the fourth NMOS transistor is connected to the first terminal of the second NMOS transistor, and a second terminal of the fourth NMOS transistor is connected to the second power supply terminal.

5. The write conversion circuit according to claim 2, wherein the forward circuit further comprises: an input terminal and a control terminal, wherein the input terminal of the forward circuit receives the first data, and the control terminal of the forward circuit receives the inverted signal of the second identification signal; the forward circuit outputs the first data, and the output terminal of the feedback circuit outputs an inverted signal of the first data to the feedback terminal of the forward circuit.

6. The write conversion circuit according to claim 5, wherein both the feedback circuit and the forward circuit comprise two control terminals, wherein the control terminal of the feedback circuit receives the second flag signal, and an inverted control terminal of the feedback circuit receives the inverted signal of the second identification signal;

the control terminal of the forward circuit receives the inverted signal of the second identification signal, and an inverted control terminal of the forward circuit receives the second identification signal; and the control terminal of the feedback circuit and the control terminal of the forward circuit are active-high control terminals, and the inverted control terminal of the feedback circuit and the inverted control terminal of the forward circuit are active-low control terminals.

7. The write conversion circuit according to claim 5, wherein the forward circuit comprises: a gated inverter and a second inverter, wherein an input terminal of the gated inverter receives the first data, a control terminal of the gated inverter receives the inverted signal of the second identification signal, and an inverted control terminal of the gated inverter receives the second identification signal; and an output terminal of the gated inverter is connected to an input terminal of the second inverter, the input terminal of the second inverter serves as the feedback terminal of the forward circuit, and an output terminal of the second inverter serves as the output terminal of the forward circuit.

8. The write conversion circuit according to claim 7, wherein the gated inverter comprises: a fifth PMOS transistor, a sixth PMOS transistor, a fifth NMOS transistor, and a sixth NMOS transistor, wherein a first terminal of the fifth PMOS transistor is connected to the first power supply terminal, a second terminal of the fifth PMOS transistor is connected to a first terminal of the sixth PMOS transistor, and a control terminal of the fifth PMOS transistor and a control terminal of the sixth NMOS transistor are connected together to serve as the input terminal of the gated inverter;

a second terminal of the sixth PMOS transistor and a first terminal of the fifth NMOS transistor are connected together to serve as the output terminal of the gated inverter, and a control terminal of the sixth PMOS transistor receives the second identification signal; and a second terminal of the fifth NMOS transistor is connected to a first terminal of the sixth NMOS transistor, and a control terminal of the fifth NMOS transistor receives the inverted signal of the second identification signal; a second terminal of the sixth NMOS transistor is connected to the second power supply terminal.

9. The write conversion circuit according to claim 1, further comprising: a first control circuit, wherein a first input terminal of the first control circuit receives a normal write control signal, a second input terminal of the first control circuit receives the first identification signal, a first output terminal of the first control circuit is connected to the control terminal of the first latch circuit, and a second output terminal of the first control circuit is connected to an inverted control terminal of the first latch circuit; the first output terminal of the first control circuit outputs the second identification signal, and the second output terminal of the first control circuit outputs the inverted signal of the second identification signal.

10. The write conversion circuit according to claim 9, wherein the first control circuit comprises: a first NOR gate and a third inverter, wherein a first input terminal of the first NOR gate receives the normal write control signal, a second input terminal of the first NOR gate receives the first identification signal, an output terminal of the first NOR gate is connected to an input terminal of the third inverter, an output terminal of the third inverter outputs the second identification signal, and the output terminal of the first NOR gate outputs the inverted signal of the second identification signal.

11. The write conversion circuit according to claim 1, further comprising: a fourth control circuit, wherein a first input terminal of the fourth control circuit receives a set control signal, a second input terminal of the fourth control circuit receives second data, and an output terminal of the fourth control circuit outputs the inverted signal of the second data.

12. A memory, comprising the write conversion circuit according to claim 1.

* * * * *